United States Patent
Chen et al.

(10) Patent No.: US 7,982,288 B2
(45) Date of Patent: Jul. 19, 2011

(54) SEMICONDUCTOR DEVICE AND METHOD OF FABRICATING THE SAME

(75) Inventors: Chin-Lung Chen, Hsinchu County (TW); Han-Min Huang, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 257 days.

(21) Appl. No.: 12/253,822

(22) Filed: Oct. 17, 2008

(65) Prior Publication Data

US 2010/0096702 A1 Apr. 22, 2010

(51) Int. Cl.
*H01L 27/112* (2006.01)
(52) U.S. Cl. ............ 257/548; 257/E27.081; 365/185.27
(58) Field of Classification Search .................. 257/324, 257/371, 548, E21.689, E27.081; 365/185.17, 365/185.26, 185.27
See application file for complete search history.

(56) References Cited

U.S. PATENT DOCUMENTS

| 6,448,126 B1 * | 9/2002 | Lai et al. ................. 438/216 |
| 2007/0273001 A1 * | 11/2007 | Chen et al. ............. 257/500 |

FOREIGN PATENT DOCUMENTS

WO    WO 2006051487 A1 *   5/2006

\* cited by examiner

*Primary Examiner* — Thomas L Dickey
(74) *Attorney, Agent, or Firm* — WPAT, PC; Justin King

(57) ABSTRACT

A semiconductor device including a substrate, a high voltage device, a medium voltage device and a low voltage device is provided. The substrate includes a high voltage circuit area, a medium voltage circuit area and a low voltage circuit area. The high voltage device, the medium voltage device and the low voltage device are respectively disposed in the high voltage circuit area, the medium voltage circuit area and the low voltage circuit area. The medium voltage device and the high voltage device have the same structure while the medium voltage device and the low voltage device have different structures. Further, the high voltage device, the medium voltage device and the low voltage device respectively include a first gate dielectric layer, a second gate dielectric layer and a third gate dielectric layer, and the thickness of the second gate dielectric layer is smaller than that of the first gate dielectric layer.

17 Claims, 8 Drawing Sheets

SEMICONDUCTOR DEVICE AND METHOD OF FABRICATING THE SAME

BACKGROUND OF THE INVENTION

1. Field of Invention

The present invention relates to an integrated circuit and a method of fabricating the same, and more generally to a semiconductor device and a method of fabricating the same.

2. Description of Related Art

Multi-function products with light weights, slim shapes and small sizes have become the mainstream in the market as the technology is developed. Accordingly, the operation voltage of the internal circuit of a single technology product is reduced, and the number and types of circuits or integrated circuit chips are required more.

Generally, the voltage level shift among integrated circuits with different voltage levels is performed through a voltage level shift circuit. A typical voltage level shift circuit usually receives the signal of an IC internal device from a low voltage device, passes the signal through a medium voltage device and then a high voltage device, and outputs the signal from the high voltage device.

The medium voltage device of a known voltage level shift circuit has the same size, structure and components as the high voltage device of the same, and the gate dielectric layer of the medium voltage device is as thick as that of the high voltage device. However, during the operation, the saturated current of the medium voltage device is small and the performance of the same is bad. Further, the occupied chip area becomes greater due to the larger size of the high voltage device and the medium voltage device, so that the chip reduction becomes difficult and a higher chip cost is caused.

SUMMARY OF THE INVENTION

The present invention provides a semiconductor device including a high voltage device, a medium voltage device and a low voltage device formed on a single chip. The medium voltage device has a higher saturated current, so that the semiconductor device has a better performance when applied to the voltage level shift circuit of a gate driver.

The present invention also provides a semiconductor device including a high voltage device, a medium voltage device and a low voltage device formed on a single chip. The dimension of the medium voltage device is smaller than that of the high voltage device, so that the whole dimension of the product can be significantly reduced.

The present invention further provides a method of fabricating a semiconductor device. The method is simple and low-cost and meets the market requirement.

The present invention provides a semiconductor device including a substrate, a first well of a first conductivity type, a high voltage device of a second conductivity type, a medium voltage device of the second conductivity type and a low voltage device of the second conductivity type. The substrate includes a high voltage circuit area, a medium voltage circuit area and a low voltage circuit area. The first well is disposed in the substrate. The high voltage device is disposed in the high voltage circuit area. The medium voltage device is disposed in the medium voltage circuit area. The low voltage device is disposed in the low voltage circuit area. The medium voltage device and the high voltage device have the same structure while the medium voltage device and the low voltage device have different structures. Further, the high voltage device, the medium voltage device and the low voltage device respectively include a first gate dielectric layer, a second gate dielectric layer and a third gate dielectric layer, and the thickness of the second gate dielectric layer is smaller than that of the first gate dielectric layer.

According to an embodiment of the present invention, the thickness of the second gate dielectric layer is substantially the same as that of the third gate dielectric layer.

According to an embodiment of the present invention, the high voltage device and the medium voltage device are respectively field drift MOS devices, and the low voltage device is a MOS transistor.

According to an embodiment of the present invention, the high voltage device, the medium voltage device and the low voltage device each include a gate structure and two source and drain regions of the second conductivity type. The gate structure is disposed on the substrate. The source and drain regions are disposed in the substrate beside the gate structure. In addition, the high voltage device further includes an isolation structure disposed in the substrate between the gate structure thereof and one of the source and drain regions thereof, and the medium voltage device further includes an isolation structure disposed in the substrate between the gate structure thereof and one of the source and drain regions thereof.

According to an embodiment of the present invention, the width of the isolation structure of the medium voltage device is smaller than that of the isolation structure of the high voltage device.

According to an embodiment of the present invention, the high voltage device further includes two separate second wells of the second conductivity type disposed in the first well respectively around the source and drain regions thereof, and the medium voltage device further includes two separate second wells of the second conductivity type disposed in the first well respectively around the source and drain regions thereof.

According to an embodiment of the present invention, the high voltage device, the medium voltage device and the low voltage device each include a gate structure and two source and drain regions of the second conductivity type. The gate structure is disposed on the substrate. The source and drain regions are disposed in the substrate beside the gate structure. In addition, the high voltage device further includes two isolation structures disposed in the substrate respectively between the gate structure thereof and each of the source and drain regions thereof, and the medium voltage device further includes two isolation structures disposed in the substrate respectively between the gate structure thereof and each of the source and drain regions thereof.

According to an embodiment of the present invention, the width of the isolation structures of the medium voltage device is smaller than that of the isolation structures of the high voltage device.

According to an embodiment of the present invention, the high voltage device further includes two separate second wells of the second conductivity type each disposed in the first well around a source and drain region thereof and the isolation structure adjacent to the source and drain region, and the medium voltage device further includes two separate second wells of the second conductivity type each disposed in the first well around a source and drain region thereof and the isolation structure adjacent to the source and drain region.

According to an embodiment of the present invention, the high voltage device further includes two separate grade regions of the second conductivity type and two separate drift regions of the second conductivity type. The grade regions are disposed in the first well respectively around the source and drain regions thereof. The drift regions are respectively disposed below the isolation structures thereof and connected to the grade regions thereof. In addition, the medium voltage device further includes two separate grade regions of the second conductivity type and two separate drift regions of the second conductivity type. The grade regions are disposed in the first well respectively around the source and drain regions thereof. The drift regions are respectively disposed below the isolation structures thereof and connected to the grade regions thereof.

According to an embodiment of the present invention, the first conductivity type is P-type and the second conductivity type is N-type, or the first conductivity type is N-type and the second conductivity type is P-type.

According to an embodiment of the present invention, the operation voltage range of the high voltage device is more than about 30 V, for example.

According to an embodiment of the present invention, the operation voltage range of the medium voltage device is about 10-30 V, for example.

According to an embodiment of the present invention, the operation voltage range of the low voltage device is less than about 10 V, for example.

The present invention also provides a semiconductor device including a substrate, a high voltage device, a medium voltage device and a low voltage device. The substrate includes a high voltage circuit area, a medium voltage circuit area and a low voltage circuit area. The high voltage device is disposed in the high voltage circuit area. The medium voltage device is disposed in the medium voltage circuit area. The low voltage device is disposed in the low voltage circuit area. The medium voltage device and the high voltage device have the same structure while the medium voltage device and the low voltage device have different structures. Further, the high voltage device, the medium voltage device and the low voltage device respectively include a first gate dielectric layer, a second gate dielectric layer and a third gate dielectric layer, and the thickness of the second gate dielectric layer is smaller than that of the first gate dielectric layer.

According to an embodiment of the present invention, the thickness of the second gate dielectric layer is substantially the same as that of the third gate dielectric layer.

According to an embodiment of the present invention, the high voltage device and the medium voltage device are respectively field drift CMOS devices, and the low voltage device is a CMOS transistor.

The present invention further includes a method of fabricating a semiconductor device. First, a substrate including a high voltage circuit area, a medium voltage circuit area and a low voltage circuit area is provided. Thereafter, a first well of a first conductivity type is formed in the high voltage circuit area, the medium voltage circuit area and the low voltage circuit area. Afterwards, two separate second wells of a second conductivity type are formed in the first well in each of the high voltage circuit area and the medium voltage circuit area. Further, two separate isolation structures are formed respectively in the second wells in each of the high voltage circuit area and the medium voltage circuit area. Then, a first gate dielectric layer is formed in the high voltage circuit area, the medium voltage circuit area and the low voltage circuit area. Thereafter, the first gate dielectric layer is removed in the medium voltage circuit area and the low voltage circuit area. Afterwards, a second gate dielectric layer is formed in each of the medium voltage circuit area and the low voltage circuit area, wherein the thickness of the second gate dielectric layer is smaller than that of the first gate dielectric layer. Further, a gate is formed on the first gate dielectric layer in the high voltage circuit area and on the second gate dielectric layer in each of the medium voltage circuit area and the low voltage circuit area. Then, two source and drain regions of the second conductivity type are respectively formed in the second wells beside the gate in each of the high voltage circuit area and the medium voltage circuit area and in the first well beside the gate in the low voltage circuit area.

According to an embodiment of the present invention, the first conductivity type is P-type and the second conductivity type is N-type, or the first conductivity type is N-type and the second conductivity type is P-type.

According to an embodiment of the present invention, the method of removing the first gate dielectric layer in the medium voltage circuit area and the low voltage circuit area includes the following steps. First, a photoresist layer is formed on the substrate. The photoresist layer has two openings to expose the first gate dielectric layer respectively in the medium voltage circuit area and the low voltage circuit area. Thereafter, an etching process is performed to remove the first gate dielectric layer in the medium voltage circuit area and the low voltage circuit area. Afterwards, the photoresist layer is removed.

In the present invention, the medium voltage device of the semiconductor device has a higher saturated current, so that the semiconductor device has a better performance when applied to the voltage level shift circuit of a gate driver. Further, the dimension of the medium voltage device is smaller than that of the high voltage device, so that the whole dimension of the product can be significantly reduced. In addition, the method of fabricating a semiconductor device is simple and low-cost and meets the market requirement.

In order to make the aforementioned and other objects, features and advantages of the present invention comprehensible, a preferred embodiment accompanied with figures is described in detail below.

DESCRIPTION OF EMBODIMENTS

Figure 1:
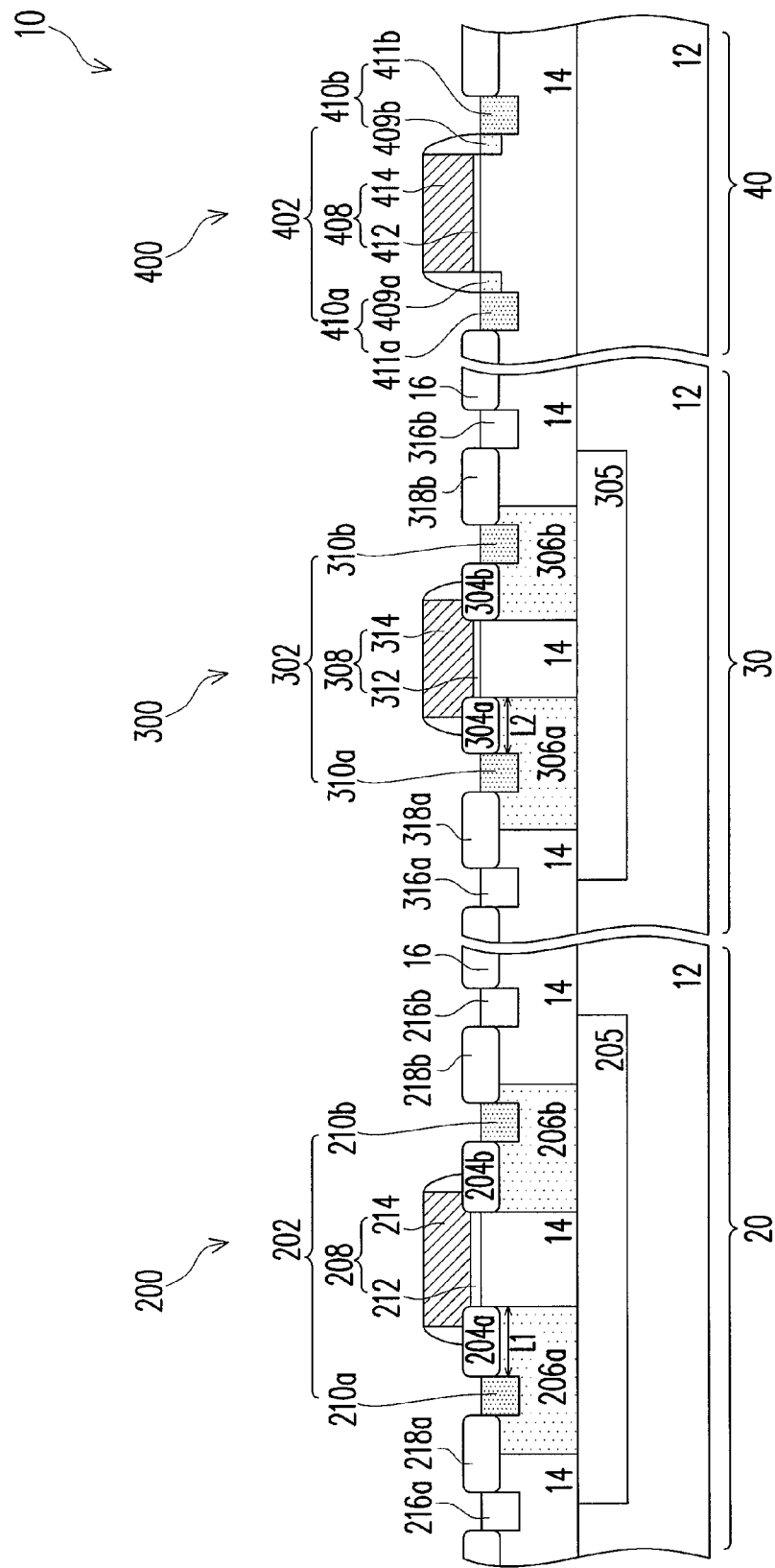
FIG. 1 schematically illustrates a cross-section view of a semiconductor device according to an embodiment of the present invention.

FIG. 1 schematically illustrates a cross-section view of a semiconductor device according to an embodiment of the present invention.

Referring to FIG. 1, a semiconductor device 10 of the present invention includes a substrate 12 of a first conductivity type or a substrate 12 having a first well 14 of a first conductivity type therein, a high voltage device 200 of a second conductivity type, a medium voltage device 300 of the second conductivity type and a low voltage device 400 of the second conductivity type. In the following embodiments, the present invention is illustrated by a substrate 12 having a first well 14 of a first conductivity type. The first conductivity type is different from the second conductivity type. For example, the first conductivity is P-type and the second conductivity type is N-type, or the first conductivity type is N-type and the second conductivity type is P-type.

The substrate 12 includes a semiconductor material such as silicon. The substrate 12 includes a high voltage circuit area 20, a medium voltage circuit area 30 and a low voltage circuit area 40. The high voltage device 200, the medium voltage device 300 and the low voltage device 400 are respectively disposed in the high voltage circuit area 20, the medium voltage circuit area 30 and the low voltage circuit area 40. In the semiconductor device 10, the high voltage device 200, the medium voltage device 300 and the low voltage device 400 are separated by isolation structures 16.

As shown in FIG. 1, the high voltage device 200 is, for example but not limited to, a field drift metal-oxide-semiconductor (FD MOS) device, and the operation voltage range thereof is more than about 30 V. In details, the high voltage device 200 includes a metal-oxide-semiconductor (MOS) transistor 202 having a channel of the second conductivity type, isolation structures 204a and 204b, and two second wells 206a and 206b of the second conductivity type. The MOS transistor 202 includes a gate structure 208 and two source and drain regions 210a and 210b. The gate structure 208 includes a gate dielectric layer 212 and a gate 214 disposed on the gate dielectric layer 212. The gate dielectric layer 212 includes silicon oxide, for example. The gate 214 includes doped polysilicon. The source and drain regions 210a and 210b are doped regions of the second conductivity type respectively disposed in the second wells 206a and 206b beside the gate structure 208. Under a certain voltage operation condition, the source and drain region 210a serves as a source region, and the source and drain region 210b serves as a drain region. However, under another voltage operation condition, the source and drain region 210b serves as a source region, and the source and drain region 210a serves as a drain region. The isolation structures 204a and 204b with a width L1 are respectively disposed in the second wells 206a and 206b between the gate structure 208 and each of the source and drain regions 210a and 210b. The isolation structures 204a and 204b and the second wells 206a and 206b are used to alleviate the hot electron effect, so as to increase the breakdown voltage of the source and drain regions 210a and 210b. In some embodiments, the high voltage device 200 further includes a barrier layer 205 disposed in the substrate 12 below the first well 14 and the second wells 206a and 206b. In addition, the high voltage device 200 further includes two doped regions 216a and 216b of the first conductivity type disposed in the first well 14. The doped region 216a and the source and drain region 210a are separated by an isolation structure 218a. The doped region 216b and the source and drain region 210b are separated by an isolation structure 218b.

As shown in FIG. 1, the low voltage device 400 is, for example but not limited to, a MOS transistor, and the operation voltage range thereof is less than about 10 V. In details, the low voltage device 400 includes a MOS transistor 402 having a channel of the second conductivity type. The MOS transistor 402 includes a gate structure 408 and two source and drain regions 410a and 410b. The gate structure 408 includes a gate dielectric layer 412 and a gate 414 disposed on the gate dielectric layer 412. The gate dielectric layer 412 includes silicon oxide, for example. The gate 414 includes doped polysilicon. The source and drain regions 410a and 410b are disposed in the first well 14. The source and drain region 410a includes a heavily doped region 411a of the second conductivity type and a lightly doped region 409a of the second conductivity type. The source and drain region 410b includes a heavily doped region 411b of the second conductivity type and a lightly doped region 409b of the second conductivity type. Under a certain voltage operation condition, the source and drain region 410a serves as a source region, and the source and drain region 410b serves as a drain region. However, under another voltage operation condition, the source and drain region 410b serves as a source region, and the source and drain region 410a serves as a drain region.

In other words, in the present invention, the low voltage device 400 and the high voltage device 200 have different structures. Different structures mean different forming components. In details, the low voltage device 400 neither includes two isolation structures between the gate structure 408 and each of the source and drain regions 410a and 410b, nor includes two second wells of the second conductivity type in the first well 14. Further, the thickness of the gate dielectric layer 412 of the low voltage device 400 is much smaller than that of the gate dielectric layer 212 of the high voltage device 200.

As shown in FIG. 1, the medium voltage device 300 is, for example but not limited to, a FD MOS device, and the operation voltage range thereof is about 10-30 V. In details, the medium voltage device 300 includes a MOS transistor 302 having a channel of the second conductivity type, isolation structures 304a and 304b, and two second wells 306a and 306b of the second conductivity type. The MOS transistor 302 includes a gate structure 308 and two source and drain regions 310a and 310b. The gate structure 308 includes a gate dielectric layer 312 and a gate 314 disposed on the gate dielectric layer 312. The gate dielectric layer 312 includes silicon oxide, for example. The gate 314 includes doped polysilicon. The source and drain regions 310a and 310b are doped regions of the second conductivity type respectively disposed in the second wells 306a and 306b beside the gate structure 308. Under a certain voltage operation condition, the source and drain region 310a serves as a source region, and the source and drain region 310b serves as a drain region. However, under another voltage operation condition, the source and drain region 310b serves as a source region, and the source and drain region 310a serves as a drain region. The isolation structures 304a and 304b with a width L2 are respectively disposed in the second wells 306a and 306b between the gate structure 308 and each of the source and drain regions 310a and 310b. The isolation structures 304a and 304b and the second wells 306a and 306b are used to alleviate the hot electron effect, so as to increase the breakdown voltage of the source and drain regions 310a and 310b. In some embodiments, the medium voltage device 300 further includes a barrier layer 305 disposed in the substrate 12 below the first well 14 and the second wells 306a and 306b. In addition, the medium voltage device 300 further includes two doped regions 316a and 316b of the first conductivity type disposed in the first well 14. The doped region 316a and the source and drain region 310a are separated by an isolation structure 318a. The doped region 316b and the source and drain region 310b are separated by an isolation structure 318b.

In other words, in the present invention, the medium voltage device 300 and the low voltage device 400 have different structures, but the thickness of the gate dielectric layer 312 of the medium voltage device 300 is substantially the same as that of the gate dielectric layer 412 of the low voltage device 400. Further, the medium voltage device 300 has the same structure as the high voltage device 200, but the thickness of the gate dielectric layer 312 of the medium voltage device 300 is much smaller that that of the gate dielectric layer 212 of the high voltage device 200. Moreover, the width L2 of the isolation structures 304a and 304b of the medium voltage device 300 is smaller than the width L1 of the isolation structures 204a and 204b of the high voltage device 200. Different structures mean different forming components. Same structure means same forming components but the dimensions thereof are not necessary to be the same.

In the present invention, the gate dielectric layer 312 of the medium voltage device 300 is as thick as the gate dielectric layer 212 of the low voltage device 200, so that the medium voltage device 300 of the present invention can provide a larger saturated current than a conventional medium voltage device with a thicker gate dielectric layer. The saturated current of the medium voltage device 300 of the present invention is about 2.5-3.5 times that of the conventional medium voltage device. Therefore, the semiconductor device 10 of the present invention has a better performance when applied to the voltage level shift circuit of a gate driver.

Further, since the medium voltage device 300 can provide a larger saturated current, the width L2 of the isolation structures 304a and 304b can be reduced. In addition, the required width of the isolation structures 304a and 304b of the medium voltage device 300 can be significantly reduced, so that the dimension of the medium voltage device 300 can be effectively reduced as well.

Moreover, the high voltage device 200, the medium voltage device 300 and the low voltage device 400 can be formed simultaneously on a single chip, so that the whole dimension of the product can be significantly reduced.

Figure 2:
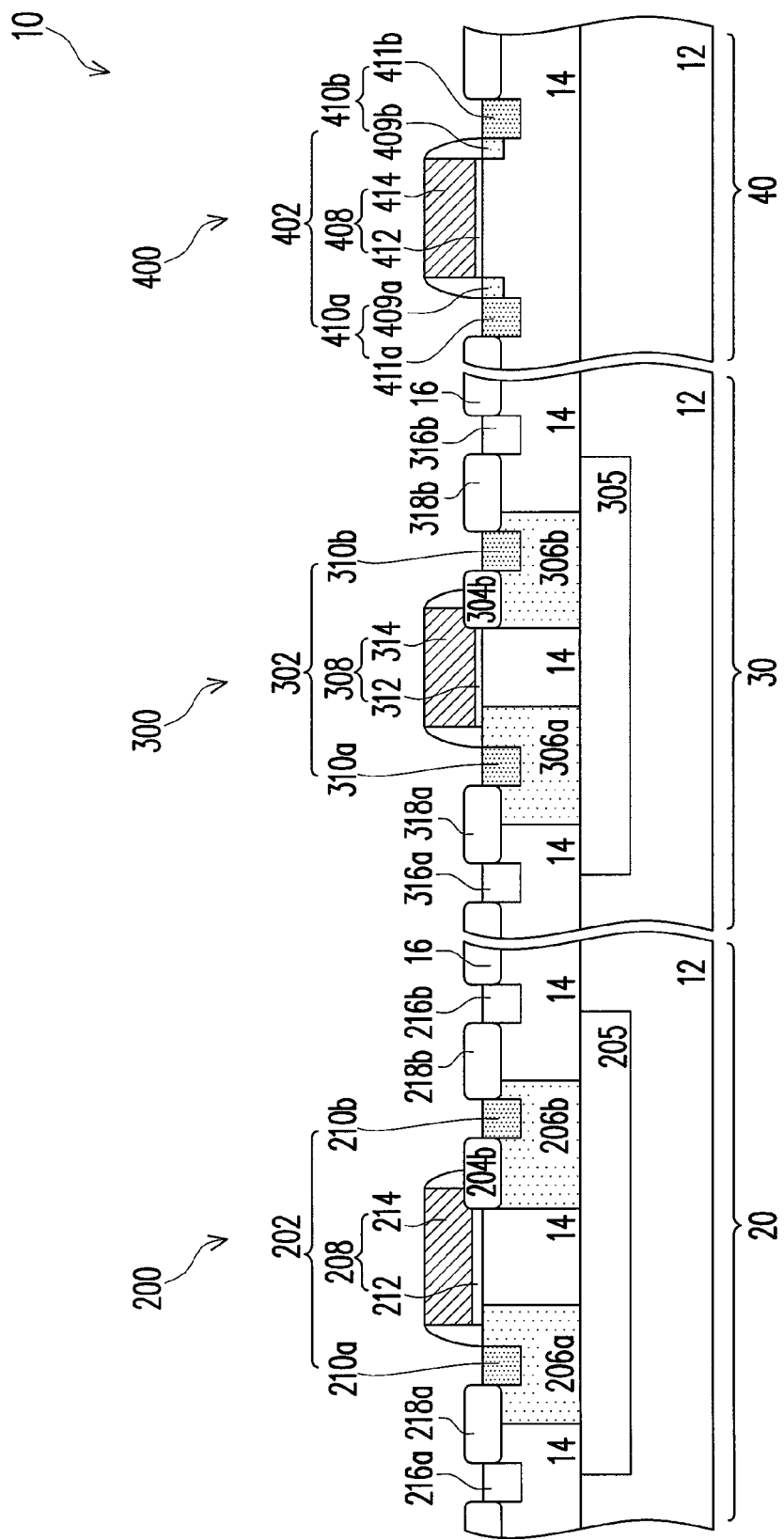
FIG. 2 schematically illustrates a cross-section view of a semiconductor device according to another embodiment of the present invention.

As shown in FIG. 1, in the above-mentioned embodiment, each of the source and drain regions 210a and 210b of the high voltage device 200 and the source and drain regions 310a and 310b of the medium voltage device 300 is either a source region or a drain region depends on the voltage operation conditions. For example, under a certain voltage operation condition, the source and drain regions 210a and 310a serve as source regions, and the source and drain regions 210b and 310b serve as drain regions. However, under another voltage operation condition, the source and drain regions 210a and 310a serve as drain regions, and the source and drain regions 210b and 310b serve as source regions. Therefore, the isolation structures 204a and 204b are required to form respectively between the gate structure 208 and each of the source and drain regions 210a and 210b, and the isolation structures 304a and 304b are required to form respectively between the gate structure 308 and each of the source and drain regions 310a and 310b. That is, the high voltage device 200 and the medium voltage device 300 respectively have symmetric structures. However, in another embodiment, if the regions 210b and 310b are fixed to serve as drain regions and the regions 210a and 310a are fixed to serve as source regions, only the isolation structure 204b between the gate structure 208 and the drain region 210b and the isolation structure 304b between the gate structure 308 and the drain region 310b are required, and the isolation structure 204a between the gate structure 208 and the source region 210a and the isolation structure 304a between the gate structure 308 and the source region 310a are optional. As shown in FIG. 2, in the high voltage device 200, only the isolation structure 204b is formed between the gate structure 208 and the region 210b serving as a drain region. Similarly, in the medium voltage device 300, only the isolation structure 304b is formed between the gate structure 308 and the region 310b serving as a drain region. That is, the high voltage device 200 and the medium voltage device 300 respectively have asymmetric structures.

Figure 5:
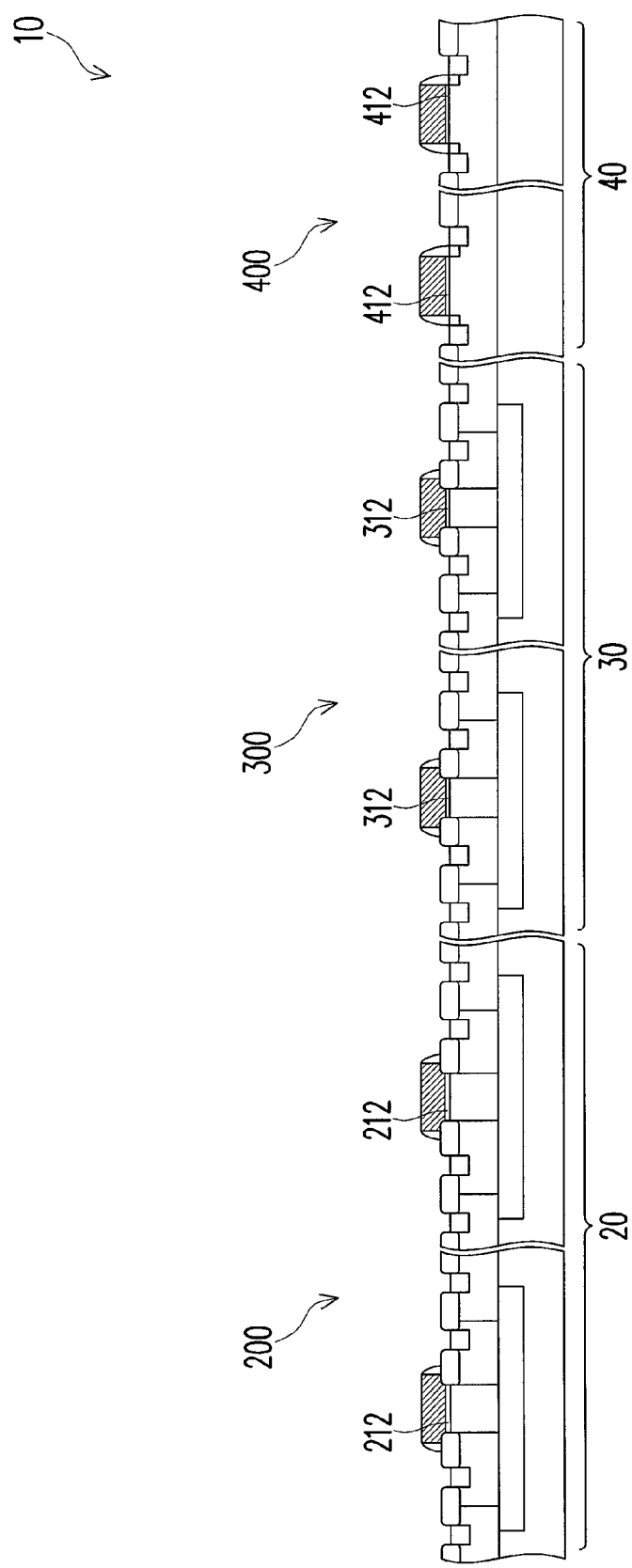
FIG. 5 schematically illustrates a cross-section view of a semiconductor device according to another embodiment of the present invention.

In the above-mentioned embodiments, the present invention is illustrated by a semiconductor device 10 including a substrate 12 of a first conductivity type or a substrate 12 having a first well 14 of a first conductivity type therein, a high voltage device 200 of a second conductivity type, a medium voltage device 300 of the second conductivity type and a low voltage device 400 of the second conductivity type. However, the present invention is not limited thereto. Each of the high voltage device 200, the medium voltage device 300 and the low voltage device 400 can have a device of the first conductivity type and another device of the second conductivity type. For example, the high voltage device 200 is a FD CMOS device including a FD NMOS device and a FD PMOS device, the medium voltage device 300 is a FD CMOS device including a FD NMOS device and a FD PMOS device, and the low voltage device 400 is a CMOS transistor including a NMOS transistor and a PMOS transistor, as shown in FIG. 5.

Figure 3:
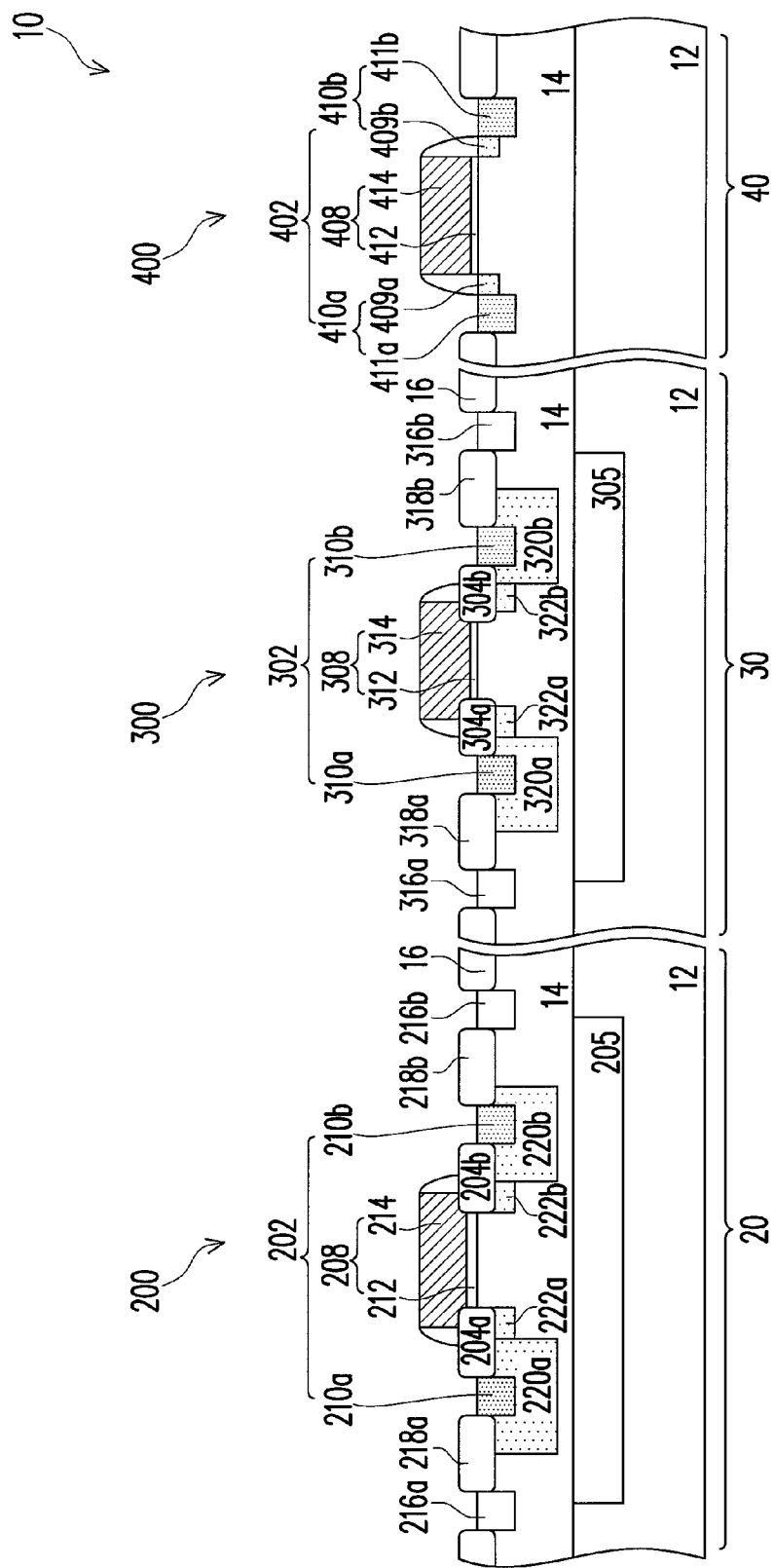
FIG. 3 schematically illustrates a cross-section view of a semiconductor device according to another embodiment of the present invention.

Further, in the above-mentioned embodiment, the high voltage device 200 and the medium voltage device 300 are illustrated by FD MOS devices. However, the present invention is not limited thereto. Some modifications and innovations may be made in the high voltage device 200 and the medium voltage device 300 without departing from the spirit and scope of the present invention. For example, referring to FIGS. 3 and 1, in the high voltage device 200, grade regions 220a and 220b of the second conductivity type and drift regions 222a and 222b of the second conductivity type can replace the second wells 206a and 206b of the second conductivity type. Similarly, in the medium voltage device 300, grade regions 320a and 320b of the second conductivity type and drift regions 322a and 322b of the second conductivity type can replace the second wells 306a and 306b of the second conductivity type. The grade regions 220a and 220b are disposed in the first well 14 respectively around the source and drain regions 210a and 210b, and the grade regions 320a and 320b are disposed in the first well 14 respectively around the source and drain regions 310a and 310b. The drift regions 222a and 222b are respectively disposed below the isolation structures 204a and 204b and electronically connected to the grade regions 220a and 220b, and drift regions 322a and 322b are respectively disposed below the isolation structures 304a and 304b and electronically connected to the grade regions 320a and 320b.

According to the symmetric and asymmetric structures depicted in FIGS. 1 and 2, symmetric and asymmetric medium voltage devices each including a gate dielectric layer of 150 Å thick and other symmetric and asymmetric medium voltage devices each including a gate dielectric layer of 850 Å thick are fabricated. The parameters are measured when 5 V is applied to the gate and 20 V is applied to the drain region. The testing results are shown in Table 1.

TABLE 1

| FD NMOS device | parameters | gate dielectric layer (150 Å) | gate dielectric layer (850 Å) |
|---|---|---|---|
| Symmetric structure | Turn on voltage | 0.68 V | 1.0 V |
| | Breakdown voltage | 44 V | 60 V |
| | Saturated current | 1.55 mA | 0.6 mA |
| Asymmetric structure | Turn on voltage | 0.72 V | 1.7 V |
| | Breakdown voltage | 37 V | 50 V |
| | Saturated current | 2.95 mA | 0.6 mA |

As shown in Table 1, when the thickness of the gate dielectric layer is reduced from 850 Å to 150 Å, the saturated current is enhanced by about 2.5 times in the medium voltage device with a symmetric structure, and the saturated current is enhanced by about 5 times in the medium voltage device with an asymmetric structure. Further, the breakdown voltage of the medium voltage device including a gate dielectric layer of 150 Å thick is still more than 37 V and meets the requirement of the voltage level shift circuit of a gate driver.

FIGS. 4A to 4D are schematic cross-section views illustrating a method of fabricating a semiconductor device according to an embodiment of the present invention.

Figure 4A:
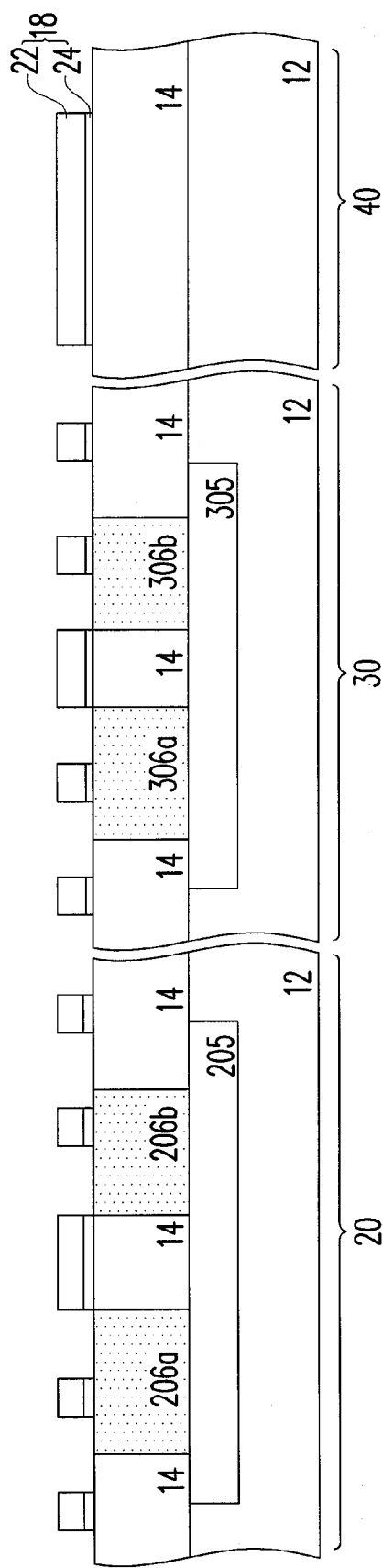
FIGS. 4A to 4D are schematic cross-section views illustrating a method of fabricating a semiconductor device according to an embodiment of the present invention.

Referring to FIG. 4A, a substrate 12 is provided. The substrate 12 is a P-type silicon substrate or an N-type silicon substrate, for example. The substrate 12 includes a high voltage circuit area 20, a medium voltage circuit area 30 and a low voltage circuit area 40. Thereafter, a first well 14 of a first conductivity type is formed in the high voltage circuit area 20, the medium voltage circuit 30 area and the low voltage circuit area 40. Afterwards, two second wells 206a and 206b of a second conductivity type are formed in the first well 14 in the high voltage circuit area 20, and two second wells 306a and 306b of the second conductivity type are formed in the first well 14 in the medium voltage circuit area 30. In an embodiment, the method of forming the first well 14 includes performing an ion implantation process with dopants of the first conductivity type, and the method of forming the second wells 206a, 206b, 306a and 306b includes performing another ion implantation process with dopants of the second conductivity type, so as to directly form the first well 14 and the second wells 206a, 206b, 306a and 306b in the substrate 12. In another embodiment, an epitaxial layer of the first conductivity type is formed on the substrate 12, and an ion implantation process with dopants of the second conductivity type is then performed, so as to form the first well 14 and the second wells 206a, 206b, 306a and 306b in the epitaxial layer. The method of forming the epitaxial layer includes performing a chemical vapor deposition (CVD) process with in-situ dopants of the first conductivity type to form an amorphous silicon material layer (not shown), and then performing a solid phase epitaxial (SPE) process to the amorphous silicon material layer.

In some embodiments, before the step of forming the first well 14, barrier layers 205 and 305 of the second conductivity type are formed below the region for forming the first well 14 in the high voltage circuit area 20 and the medium voltage circuit area 30. Thereafter, a mask layer 18 is formed on the substrate 12 to define the active areas. The mask layer 18 includes a pad oxide layer 24 and a silicon nitride layer 22 sequentially formed on the substrate 12.

Figure 4B:
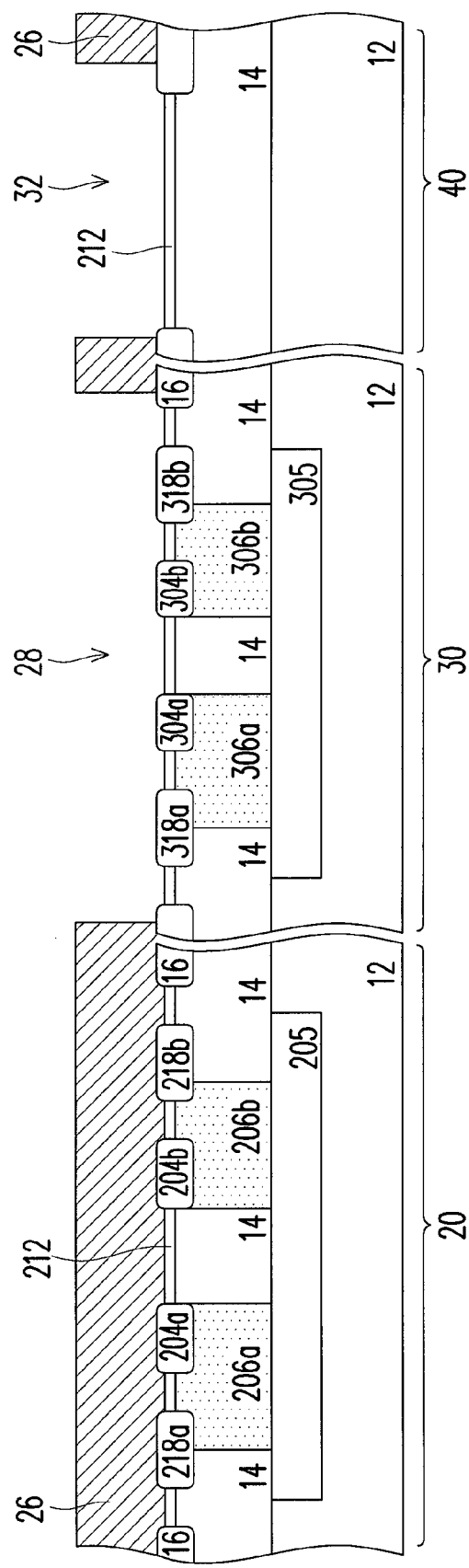

Referring to FIG. 4B, a thermal oxidation process is performed, so as to form field oxide layers on the surface of the substrate which is not covered by the mask layer 18. The field oxide layers serve as isolation structures 16, 204a, 204b, 218a, 218b, 304a, 304b, 318a and 318b. Thereafter, filed implant regions (not shown) of the first conductivity type are formed respectively below the isolation structures 218a, 218b, 318a and 318b. Afterwards, a first gate dielectric layer 212 is formed on the surface of the exposed substrate 12 in the high voltage circuit area 20, the medium voltage circuit area 30 and the low voltage circuit area 40. The method of forming the gate dielectric layer 212 includes performing a thermal oxidation process to form a silicon oxide layer with a thickness of about 850 Å. Further, a step for adjusting the turn on voltage is performed. Thereafter, a photoresist layer 26 is formed on the gate dielectric layer 212. The photoresist layer 26 covers the gate dielectric layer 212 in the high voltage circuit area 20 and has two openings 28 and 32 to expose the gate dielectric layer 212 respectively in the medium voltage circuit area 30 and the low voltage circuit area 40.

Figure 4C:
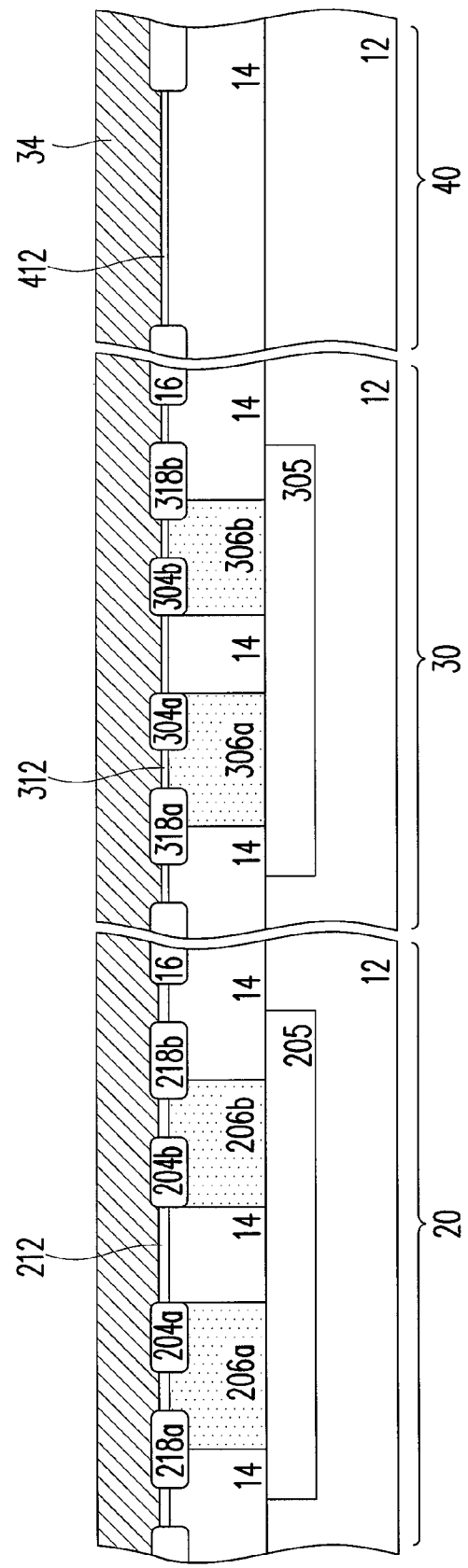

Referring to FIG. 4C, the gate dielectric layer 212 exposed by the openings 28 and 32 are removed, so as to expose the surface of the substrate 12 in the medium voltage circuit area 30 and the low voltage circuit area 40. The method of removing the gate dielectric layer 212 exposed by the openings 28 and 32 includes performing a wet etching process with hydrofluoric acid. Thereafter, the photoresist layer 26 is removed. Afterwards, a gate dielectric layer 312 is formed on the surface of the exposed substrate 12 in the medium voltage circuit area 30 and a gate dielectric layer 412 is formed on the surface of the exposed substrate 12 in the low voltage circuit area 40. The thickness of the gate dielectric layer 312 is substantially the same as that of the gate dielectric layer 412, and the gate dielectric layers 312 and 412 can be formed simultaneously. The method of forming the dielectric layers 312 and 412 includes performing a thermal oxidation process to form a silicon oxide layer with a thickness of about 150 Å. A conductive layer 34 is then formed. The conductive layer 34 includes doped polysilicon, and the forming method thereof includes performing a CVD process.

Figure 4D:
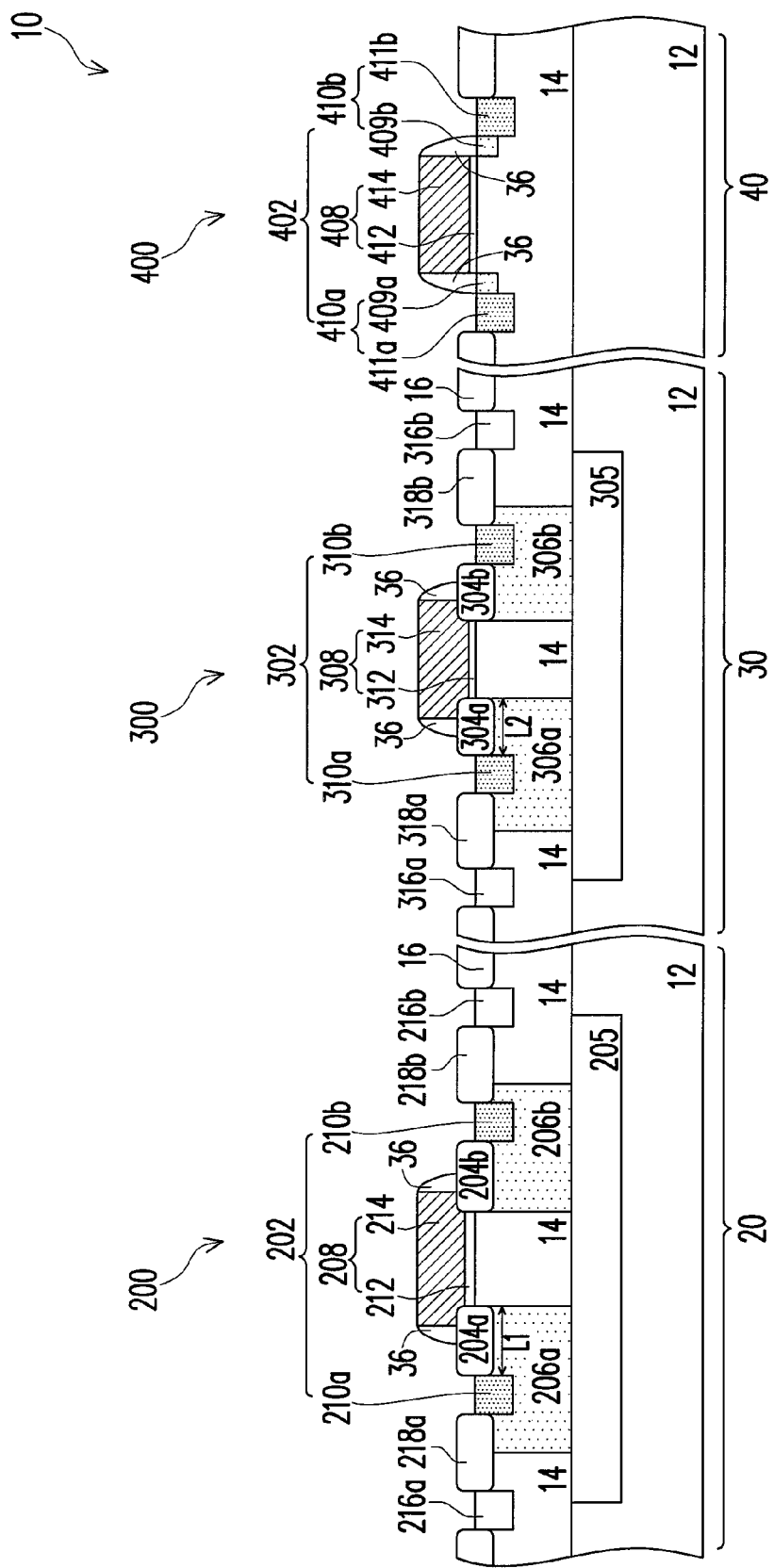

Referring to FIG. 4D, the conductive layer 34 is patterned, so as to form gates 214, 314 and 414 respectively in the high voltage circuit area 20, the medium voltage circuit area 30 and the low voltage circuit area 40. The gate 214 and the gate dielectric layer 212 form a gate structure 208. The gate 314 and the gate dielectric layer 312 form a gate structure 308. The gate 414 and the gate dielectric layer 412 form a gate structure 408. Thereafter, lightly doped regions 409a and 409b of the second conductivity type are formed beside the gate structure 408 in the low voltage circuit area 40. Spacers 36 are then formed on the sidewalls of the gate structures 208, 308 and 408. Afterwards, source and drain regions 210a and 210b of the second conductivity type are formed respectively in the second wells 206a and 206b beside the gate structure 208 in the high voltage circuit area 20, source and drain regions 310a and 310b of the second conductivity type are formed respectively in the second wells 306a and 306b beside the gate structure 308 in the medium voltage circuit area 30, and heavily doped regions 411a and 411b of the second conductivity type are formed in the first well 14 beside the gate structure 408 in the low voltage circuit area 40. The heavily doped regions 411a and 411b are electronically connected to the light doped regions 409a and 409b and form source and drain regions 410a and 410b with the light doped regions 409a and 409b. Further, doped regions 216a and 216b are formed in the first well 14 in the high voltage circuit area 20, and doped regions 316a and 316b are formed in the first well 14 in the medium voltage circuit area 30.

In the present invention, the method of fabricating a semiconductor device is simple and low-cost and meets the market requirement.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:
1. A semiconductor device, comprising:
   a substrate, comprising a high voltage circuit area, a medium voltage circuit area and a low voltage circuit area;
   a first well of a first conductivity type, disposed in the substrate;
   a high voltage device of a second conductivity type, disposed in the high voltage circuit area;
   a medium voltage device of the second conductivity type, disposed in the medium voltage circuit area; and
   a low voltage device of the second conductivity type, disposed in the low voltage circuit area, wherein a structure of the medium voltage device is the same as a structure of the high voltage device while the structure of the medium voltage device is different from a structure of the low voltage device;

wherein the high voltage device, the medium voltage device and the low voltage device respectively comprise a first gate dielectric layer, a second gate dielectric layer and a third gate dielectric layer, and a thickness of the second gate dielectric layer is smaller than a thickness of the first gate dielectric layer; and wherein the high voltage device and the medium voltage device each comprise:

a gate structure, disposed on the substrate;

two source and drain regions of the second conductivity type, disposed in the substrate beside the gate structure; and at least one isolation structure disposed in the substrate between the gate structure thereof and one of the two source and drain regions thereof.

2. The device of claim 1, wherein the thickness of the second gate dielectric layer is substantially the same as a thickness of the third gate dielectric layer.

3. The device of claim 1, wherein the high voltage device and the medium voltage device are respectively field drift MOS devices, and the low voltage device is a MOS transistor.

4. The device of claim 1, wherein
the at least one isolation structure comprises an isolation structure disposed in the substrate between the gate structure thereof and one of the two source and drain regions thereof.

5. The device of claim 4, wherein a width of the isolation structure of the medium voltage device is smaller than a width of the isolation structure of the high voltage device.

6. The device of claim 4, wherein the high voltage device further comprises two separate second wells of the second conductivity type disposed in the first well respectively around the source and drain regions thereof, and the medium voltage device further comprises two separate second wells of the second conductivity type disposed in the first well respectively around the source and drain regions thereof.

7. The device of claim 1, wherein
the at least one isolation structure comprises two isolation structures disposed in the substrate respectively between the gate structure thereof and each of the two source and drain regions thereof.

8. The device of claim 7, wherein a width of the isolation structures of the medium voltage device is smaller than a width of the isolation structures of the high voltage device.

9. The device of claim 7, wherein the high voltage device further comprises two separate second wells of the second conductivity type each disposed in the first well around a source and drain region thereof and the isolation structure adjacent to the source and drain region, and the medium voltage device further comprises two separate second wells of the second conductivity type each disposed in the first well around a source and drain region thereof and the isolation structure adjacent to the source and drain region.

10. The device of claim 7, wherein the high voltage device further comprises:

two separate grade regions of the second conductivity type, disposed in the first well respectively around the source and drain regions thereof; and two separate drift regions of the second conductivity type, respectively disposed below the isolation structures thereof and connected to the grade regions thereof; and wherein the medium voltage device further comprises:

two separate grade regions of the second conductivity type, disposed in the first well respectively around the source and drain regions thereof; and two separate drift regions of the second conductivity type, respectively disposed below the isolation structures thereof and connected to the grade regions thereof.

11. The device of claim 1, wherein the first conductivity type is P-type and the second conductivity type is N-type, or the first conductivity type is N-type and the second conductivity type is P-type.

12. The device of claim 1, wherein an operation voltage range of the high voltage device is more than about 30 V.

13. The device of claim 1, wherein an operation voltage range of the medium voltage device is about 10-30 V.

14. The device of claim 1, wherein an operation voltage range of the low voltage device is less than about 10 V.

15. A semiconductor device, comprising:

a substrate, comprising a high voltage circuit area, a medium voltage circuit area and a low voltage circuit area;

a high voltage device, disposed in the high voltage circuit area;

a medium voltage device, disposed in the medium voltage circuit area; and a low voltage device, disposed in the low voltage circuit area, wherein a structure of the medium voltage device is the same as a structure of the high voltage device while the structure of the medium voltage device is different from a structure of the low voltage device;

wherein the high voltage device, the medium voltage device and the low voltage device respectively comprise a first gate dielectric layer, a second gate dielectric layer and a third gate dielectric layer, and a thickness of the second gate dielectric layer is smaller than a thickness of the first gate dielectric layer; and wherein the high voltage device and the medium voltage device each comprise:

a gate structure, disposed on the substrate;

two source and drain regions of the second conductivity type, disposed in the substrate beside the gate structure; and at least an isolation structure disposed in the substrate between the gate structure thereof and one of the two source and drain regions thereof.

16. The device of claim 15, wherein the thickness of the second gate dielectric layer is substantially the same as a thickness of the third gate dielectric layer.

17. The device of claim 15, wherein the high voltage device and the medium voltage device are respectively field drift CMOS devices, and the low voltage device is a CMOS transistor.

* * * * *